(12) United States Patent
Montperrus et al.

(10) Patent No.: US 7,148,728 B2
(45) Date of Patent: Dec. 12, 2006

(54) DIGITAL DELAY DEVICE, DIGITAL OSCILLATOR CLOCK SIGNAL GENERATOR AND MEMORY INTERFACE

(75) Inventors: Luc Montperrus, Montigny le Bretonneux (FR); Philippe Boucard, le Chesnay (FR); Jean-Jacques Lecler, Cagnes sur Mer (FR)

(73) Assignee: Arteris, Guyancourt Cedex (FR)

( * ) Notice: Subject to any disclaimer, the term of this patent is extended or adjusted under 35 U.S.C. 154(b) by 35 days.

(21) Appl. No.: 10/957,211

(22) Filed: Oct. 1, 2004

(65) Prior Publication Data

US 2005/0104644 A1 May 19, 2005

(30) Foreign Application Priority Data

Oct. 1, 2003 (FR) .................................... 0311517

(51) Int. Cl.
*H03L 7/06* (2006.01)
(52) U.S. Cl. ...................................... 327/149; 327/158
(58) Field of Classification Search ................ 327/149, 327/153, 150, 161, 261–265, 276–279, 158; 331/17, 25; 375/373, 375, 376, 374
See application file for complete search history.

(56) References Cited

U.S. PATENT DOCUMENTS

| | | | | |
|---|---|---|---|---|
| 5,424,590 | A | 6/1995 | Sato et al. | 327/276 |
| 5,495,197 | A | 2/1996 | Hayashi et al. | 327/276 |
| 5,844,954 | A | 12/1998 | Casasanta et al. | 375/373 |
| 6,211,739 | B1 | 4/2001 | Synder et al. | 331/1 A |
| 6,339,553 | B1 | 1/2002 | Kuge | 365/194 |
| 6,759,911 | B1 * | 7/2004 | Gomm et al. | 331/10 |
| 6,812,760 | B1 * | 11/2004 | Kim et al. | 327/158 |
| 2002/0008560 | A1 | 1/2002 | Yamazaki et al. | 327/277 |

FOREIGN PATENT DOCUMENTS

| | | |
|---|---|---|
| EP | 0 704 975 | 4/1996 |
| FR | 2814007 | 3/2002 |
| FR | 2815198 | 4/2002 |

OTHER PUBLICATIONS

English translation of Abstract for French Patent No. 2815198, 1 page.
English translation of Abstract for French Patent No. 2814007, 1 page.
Olsson, T. and P. Nilsson, "A Digital PLL made from Standard Cells" *Proceedings from European Conference on Circuit Theory and Design* (ECCTD) 2001, 4 pages.
Olsson, T. and P. Nilsson, "Fully integrated standard cell digital PLL" *Electronic Letters*, vol. 37, No. 4, Feb. 15, 2001, pp. 211-212.
Olsson, T. and P. Nilsson, "A Digitally Controlled PLL for Digital SOCs" *IEEE International Symposium on Circuits and Systems*, 2003, 4 pages.
Preliminary Examination Report for French Patent Application No. 03/11517 issued May 12, 2004.

* cited by examiner

*Primary Examiner*—Linh My Nguyen
(74) *Attorney, Agent, or Firm*—Meyertons, Hood, Kivlin, Kowert & Goetzel, P.C.; Eric B. Meyertons

(57) ABSTRACT

Digitally controlled delay device, including a plurality of fine delay elements and a plurality of coarse delay elements, capable of delaying a signal generated by the device, by a fine or coarse delay respectively, the fine delay elements having delay times of between 60 and 170% of the mean of the fine delays and the sum of the fine delay times being greater than or equal to at least one coarse delay.

16 Claims, 5 Drawing Sheets

DIGITAL DELAY DEVICE, DIGITAL OSCILLATOR CLOCK SIGNAL GENERATOR AND MEMORY INTERFACE

BACKGROUND OF THE INVENTION

1. Field of the Invention

The present invention generally relates to the field of digital delay devices, digital oscillators including such delay devices and, more generally, clock signal generators which generally include at least one digital oscillator.

2. Description of the Relevant Art

There is known, from the article entitled "An all-Digital PLL Clock Multiplier" by Messrs Thomas Olsson and Peter Nilsson, ap-asik 2002, available at the address www.ap-asik.org/2002/Proceedings/5B 3.pdf, a digital phase locked loop produced in integrated technology on the basis of standard cells found in most libraries of standard digital cells. The phase locked loop has a frequency within the range 152 to 366 MHz and includes a looped structure with a phase detector, a filter, a digitally controlled oscillator and a frequency divider. The filter includes a counter and a recursive digital filter. For applications demanding a high resolution and a low consumption of the digitally controlled oscillator, a specific design is preferable. For high operating frequencies, a digital-to-analogue converter followed by a voltage-controlled oscillator may be a good alternative.

As known, digital systems on integrated circuits require clocks for timing their functioning. The clocks may be generated externally or internally using phase locked loops. Phase locked loops are digital or analogue and may be difficult to adjust and are relatively expensive. In fact, phase locked loop is a second order system similar to position locked loop using an error which is an acceleration. It may therefore produce instabilities in certain operating conditions.

In totally asynchronous communication systems for which maintaining phase consistency is not essential, it is possible to use a frequency locked loop whose design is simpler since only the frequency is guaranteed and not the phase with respect to the reference signal. A frequency locked loop is a first order system, similar to a speed locked loop on the basis of a measured speed error.

In other words, a phase locked loop and a frequency locked loop may be illustrated by a locked loop with a moving train. A phase locked loop amounts to choosing the start of a carriage of the train and in trying to always remain at the position of the start of the chosen carriage. Frequency locked loop is like a locked loop aiming to increase its speed or to reduce it by a fixed quantity as soon as there is a late or early carriage.

A possible implementation of a frequency locked loop uses a digitally controlled oscillator provided with programmable delays, each delay being commanded by a digital signal. Now, the precise control of delay times becomes more important as the frequency rises.

SUMMARY OF THE INVENTION

Described herein is a digital delay device capable of operating at very high frequencies from a few MHz up to several GHz, while remaining of low cost.

The digitally controlled delay device, in one embodiment, includes a plurality of fine delay elements and a plurality of coarse delay elements, capable of delaying a signal generated by the device, by a fine or coarse delay respectively. The fine delay elements have delay times of between 60 and 170% of the mean of the fine delays and the sum of the fine delay times is greater than or equal to any one of the coarse delays. In other words, the delay times of the fine delay elements are between 60% of the mean of the fine delay of the fine delay elements and 170% of the mean of the fine delay of the fine delay elements. Furthermore, the sum of the fine delay times is greater than or equal to any one of the coarse delays of the coarse delay elements. The fine delays may theoretically be equal and in practice between 86 and 116% taking account of manufacturing dispersions. The device includes an element for the control and management of the fine delay elements and of the coarse delay elements, capable of activating or deactivating the fine delay elements and coarse delay elements, according to an output of a frequency locked loop.

The delays may thus be controlled precisely. In fact, if two integrated devices are taken, the design of whose manufacturing masks is strictly identical, different delays will be measured after manufacture because of dispersions in the etchings carried out using the masks during manufacture. In analogous systems, elements are used whose dimensions are large compared with the size of the defects. On the contrary, in the case of digital cells etching widths close to the technological limits are used. This results in relatively large delay dispersions able to reach 5% and which may have an effect, particularly when it is desired to exchange a coarse delay for several fine delays in a digital oscillator.

It is possible to provide for the digital oscillator to cover at least one octave in the frequency range by means of delay elements and to do this in all possible temperature and voltage conditions and with sufficient accuracy. By way of example, in 0.13 micron etching width technology, a variation of 10° C. may increase the delay of a digitally controlled oscillator by about 20 ps. A variation of 6.7 millivolts in the supply voltage has a similar effect.

The control and management element is capable of activating and deactivating the fine delay elements and the coarse delay elements, the activation of a coarse delay element being carried out without modification of the fine delay elements, and the deactivation of a coarse delay element being carried out while activating fine delay elements in order to prevent a large change in the sum of the delays and therefore in the frequency. In this way, an output frequency of a digitally controlled oscillator is kept very slightly below the instruction frequency while being as close to it as possible.

The activation of a coarse delay time without changing the fine delays makes it possible to increase the delay significantly when the frequency becomes too high, which greatly reduces the risk of overshooting the instruction frequency, a risk whose reduction is a matter of priority. It will then be possible to activate fine delay elements in order to bring the output frequency back again as close as possible to the instruction frequency.

On the contrary, when the output frequency is too low and all of the fine delay elements have already been deactivated, it becomes necessary to deactivate at least one coarse delay element. In this case, simultaneously with the deactivation of a coarse delay element, all or a portion, but at least a significant portion, of the fine delay elements are activated in order to prevent a too sudden reduction in the delays capable of causing the output frequency to drop below the instruction frequency. In other words, the delays are reduced progressively but they may be increased suddenly. In this way, the risk of obtaining an output frequency higher than the instruction frequency, which may result in functional disorders of the circuit, is greatly reduced. The reliability of the circuit is significantly increased.

In one embodiment, the fine delay elements have delay times of between 86 and 116% of the mean of the fine delays and preferably between 90 and 110%. Similarly, the coarse delay elements may have delay times having the same relative accuracy as the fine delays.

Advantageously, the coarse delay elements have delay times spaced between each other in such a way that the sum of the fine delay times is greater than or equal to the difference between two adjacent combinations of coarse delay times. It is thus possible to achieve a precise adjustment of the sum of the delays and therefore to achieve the desired frequency correction.

Advantageously, the control and management element includes a means of synchronization of the control of the fine delay elements and of the coarse delay elements.

Advantageously, at least one fine delay element includes an active component provided with a capacitance, the delay variation being due to the Miller effect. It will be recalled here that the Miller effect is modeled by a capacitor between the drain and the gate of an MOS transistor, generally considered as a stray capacity whose effect is generally considered as having to be as slight as possible.

On the contrary, the embodiments disclosed herein take advantage of the Miller capacitance of an active component and uses it to generate a delay. It is thus possible to use a standard gate, for example a NOR gate, as a capacitance, in other words as a delay element. As the Miller capacity of a NOR gate is low, a fine delay element is thus formed. The fine delay element may include means of activation and of partial deactivation of the capacitance. The fine delay element may include a gate with at least two inputs. The gate will advantageously include an isolated output. The gate may include an input to which a signal to be delayed is applied. The gate may include a delay adjustment control input.

In one embodiment, the fine delay element includes an inverter.

In one embodiment, the fine delay element includes a transistor, an input coupled to the gate of the transistor and an output.

Advantageously, the device includes a plurality of coupled fine delay elements. A fine delay element may include a resistance and a capacitance. The resistance may be provided by an inverter. The capacitance may be provided by the gate of a NOR gate which includes a capacitance due to the Miller effect. Furthermore, it is possible to provide a means of counting a fractional part of the reference clock period.

Other embodiments include a digital oscillator including a digital delay device as described above.

Further embodiments include a clock signal generator comprising a frequency locked loop and a digital oscillator provided with a digital delay device as described above.

Using the digital delay devices described herein, an oscillator is available which is capable of functioning at high frequencies, in a reliable manner, and at reasonable cost.

the digital delay devices described herein make it possible to produce a memory interface including two delay devices, one of which is looped back. The two devices may be coupled to a same control.

BRIEF DESCRIPTION OF THE DRAWINGS

The present invention will be better understood on reading the detailed description of a few embodiments taken as examples that are in no way limiting and illustrated by the appended drawings in which.

Figure 1:
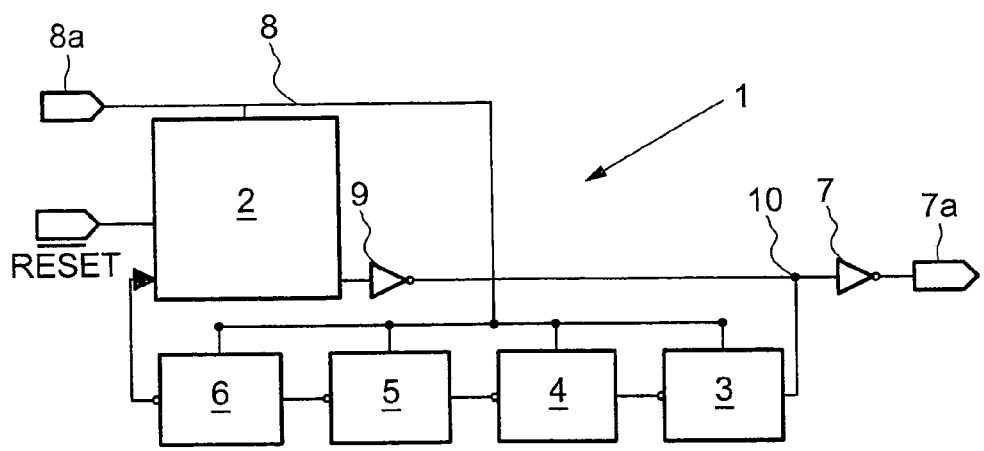
FIG. 1 is a block diagram of a digital oscillator.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As may be seen in FIG. 1, the digital delay device, given the overall reference 1, includes a coarse delays module 2, four fine delay modules 3, 4, 5 and 6, an output inverter 7, and an output 7a. A control line 8 is coupled to the coarse delays module 2 and to the fine delay modules 3 to 6 in order to transmit control commands from an input 8a. The coarse delays module 2 is furthermore coupled by a zero reset line in order to receive a zero reset command RESET.

The output of the coarse delays module 2 is coupled to an additional inverter 9. The output of the inverter 9 is coupled to a node 10 to which the input of the output inverter 7 and the input of the fine delay module 3 are also connected. The outputs of the fine delay modules 3, 4 and 5 are coupled to the inputs of the fine delay modules 4, 5 and 6 respectively. The output of the fine delay module 6 is coupled to the input of the coarse delays module 2. In this way a digitally controlled oscillator is formed whose frequency is adjustable by means of the digital delay device 1.

Preferably, the nominal delays of the fine delay modules 3 to 6 are equal. However, taking account of the inevitable dispersions during the manufacturing operations of integrated circuits, the real delay of a fine delay module is known only to within a certain margin of accuracy.

The presence of the inverter 9 is related to the fact that the fine delay modules 3 to 6 are inverters and that it is appropriate that the oscillation loop should contain an odd number of inverters in order to oscillate. Thus, if it is chosen to produce a digitally controlled oscillator provided with an odd number of fine delays, a direct connection will be provided between the output of the coarse delays module 2 and the node 10 by eliminating the inverter 9. On the contrary, in embodiments including an even number of fine delay modules, an inverter 9 is used. The coarse delays module 2 is non-inverting.

As will be seen below, the coarse delays module 2 is capable of generating a plurality of coarse delays. A fine delay module 3 to 6 is capable of generating from zero to four fine delays. The functioning of the digitally controlled oscillator is as follows. When the output of the coarse delays module 2 is at a low level, the node 10 is at a high level, which results in a high level at the output of the fine delay module 6 after the summing of the fine delays of the fine delay modules 3 to 6 according to the command received though the control line 8. A high level at the input of the coarse delays module 2 causes the setting of the output of the coarse delays module 2 to the high level after a delay equal to the sum of the active coarse delays within the coarse delays module 2, and hence the oscillation of the digitally controlled oscillator.

Figure 2:
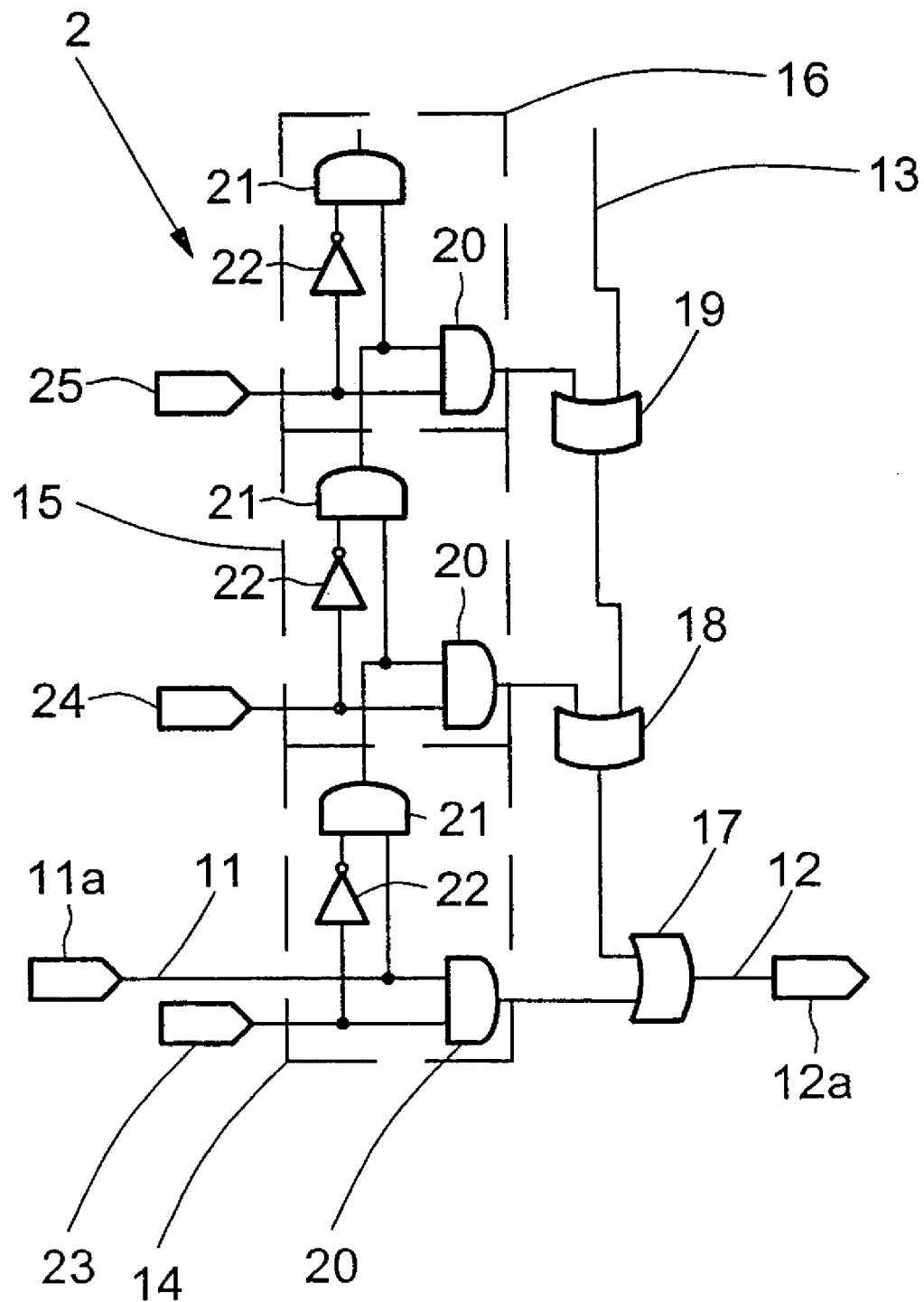
FIGS. 2 and 3 are block diagrams of two types of coarse delay modules.

FIG. 2 shows an embodiment of the coarse delays module 2 in greater detail. The coarse delays module 2 includes a signal input 11 from an input 11a, a signal output 12 to an output 12a and a control input 13. The coarse delays module 2 includes a plurality of identical sub-modules 14 to 16, in this case three of them, and an equal number of OR gates, referenced 17 to 19.

More precisely, each sub-module includes two AND gates 20 and 21 and an inverter 22. The AND gate 20 includes two inputs, one of them coupled to the input 11 in the case of the sub-module 14 and to the output of the AND gate 21 of the preceding sub-module in the case of the sub-modules 15 and 16, and the other coupled to a delay input, referenced 23, 24 and 25 respectively. The gate 21 includes an input coupled to the input of the gate 20 and another input coupled by the intermediary of the inverter 22 to the other input of the gate 20. The output of the gate 20 of each module 14 to 16 is coupled to an input of the OR gate, 17 to 19 respectively. The other input of the OR gate 17 is coupled to the output of the OR gate 18. The other input of the OR gate 18 is coupled to the output of the OR gate 19 and the other input of the OR gate 19 is coupled to the control input 13. The output of the OR gate 17 forms the output 12 of the coarse delays module.

The output of the gate 21 of the sub-module 16 remains unconnected. The gate 21 of the sub-module 16 is inactive but serves to equalize the loads between the sub-modules in order that the functioning of the sub-modules is as consistent as possible. If the input 23 is at a high level, the signal passes through the gate 20 of the sub-module 14 and the gate 17. If the input 24 is at the high level and if the input 23 is at a low level, the signal passes through the gate 21 of the sub-module 14, the gate 20 of the sub-module 15 and the gates 17 to 18. The signal is therefore delayed by an additional AND gate and an additional OR gate, resulting in a long, so-called coarse, delay. The gate 20 is synchronized on the low part of the signal to prevent adding parasitic transitions during a modification of the control signal.

FIG. 2 shows an embodiment with three sub-modules and therefore three delays. The number of sub-modules is of course adapted to each application and may be relatively high. If it is desired to reduce the value of the delays, it is possible to replace the AND gates with NAND gates and the OR gates with NOR gates. In other words, the module 2 includes one delay control input 23, 24, 25 per coarse delay having to be activated or deactivated.

Figure 3:
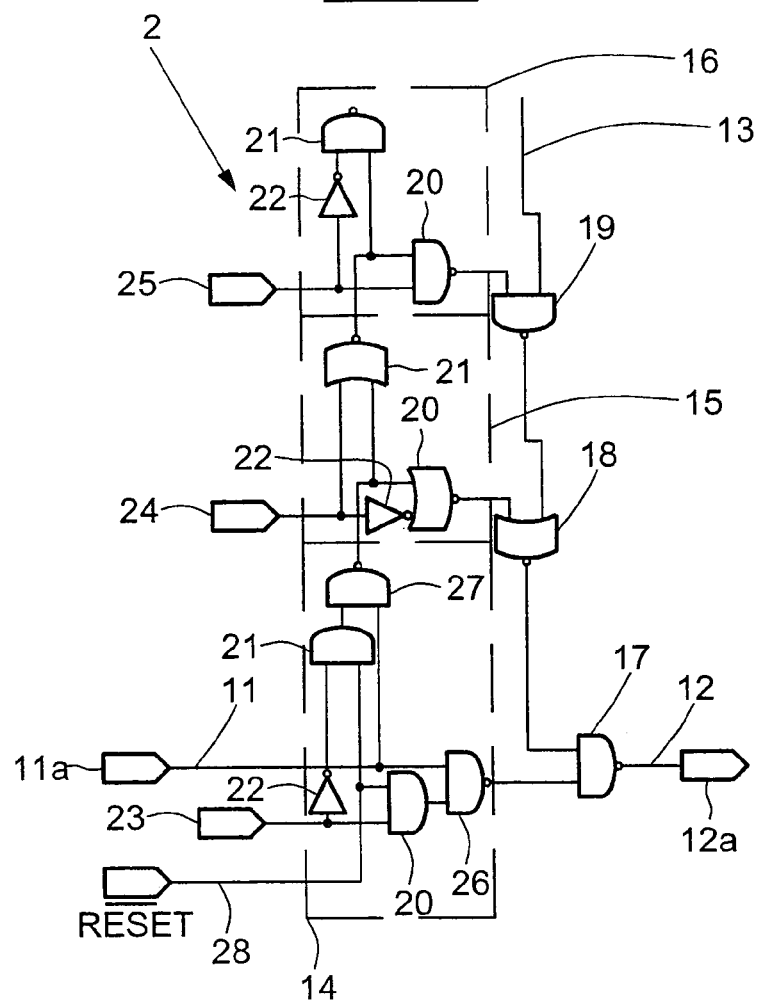

The embodiment shown in FIG. 3 is similar to the preceding one except that the sub-module 14 includes an inhibiting means in the form of two additional gates 26 and 27 and a zero reset input 28. The output of the gate 20 is coupled to an input of the NAND gate 26, the other input of the gate 26 being coupled to the input signal 11. The output of the gate 26 is coupled to the input of the gate 17 which in this case is a NAND gate. The input of the gate 20 is coupled to the delay signal 23 and the other input of the gate 20 is coupled to the zero reset signal 28. The input of the gate 21 is also coupled to the zero reset signal 28 while the other input of the gate 21 is coupled to the output of the inverter 22. The inputs of the NAND gate 27 are coupled on the one hand to the input signal 11 and, on the other hand, to the output of the gate 21. In the sub-module 15, the gates 20 and 21 are NOR gates and in the sub-module 16, the gates 20 and 21 are NAND gates. The gate 17 is a NAND gate, as is the gate 19, while the gate 18 is a NOR gate. It is thus possible to adjust the coarse delays while using pre-characterized gates available in standard libraries.

Figure 4:
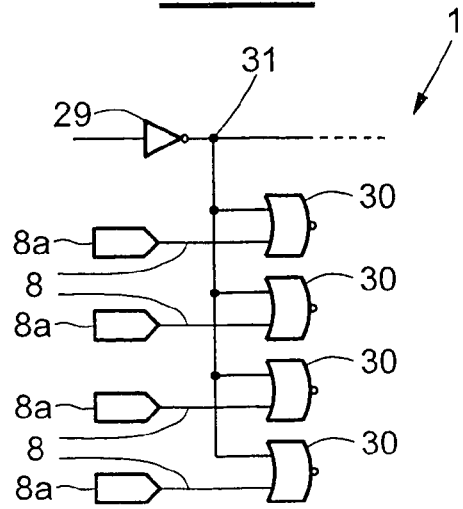
FIG. 4 is a block diagram of a fine delay module.

FIG. 4 shows an embodiment of a fine delay module. Each fine delay module includes an inverter 29 and four NOR gates, referenced 30, whose outputs are left floating and not coupled to other elements. The gates 30 each include an input coupled to a node 31, that is in common with the output of the inverter 29 and the output of the module, and another input coupled to a control line referenced 8 with an input 8a. The input of the inverter 29 forms the input of the fine delay module. As long as the control signal on the control line 8 is at a high level, the output of the gate in question 30 remains at a low level and the signal is hardly delayed. Furthermore, the fine delays may be adjusted by altering the drive of the inverter.

On the contrary, when the signal on the control line 8 is at a low level, the output level is inverted with respect to that of the input receiving the signal to be delayed and the Miller capacitance existing between the input and the output of the gate 30 has a higher voltage applied to it and hence there is a greater delay of the signal at the node 31. In fact, the input of such a gate is generally formed by the gate of an MOS transistor and the output is formed by a drain. In other words, there is added to a signal line a small capacitance existing in a logic gate in order to create a fine delay. In this way advantage is taken of a defect of logic gates, generally considered as a nuisance.

The substitution of a coarse delay by several fine delays may of course produce a few difficulties. An electrical simulation may give a number of fine delays equivalent to a coarse delay under certain temperature, voltage, manufacturing, etc. conditions, but which will not necessarily correspond to physical reality, giving rise to an uncertainty of the order of 5%. It is necessary to take account of the variations between one cell and another of the order of 5%. Furthermore, it is necessary to take account of the fact that a difference of the order of 5% may also exist between a simulation and reality. This therefore results in three sources of 5% uncertainty which, when combined, produces slightly more than 15%. However, some certainties may be correlated with each other. An uncertainty of 10% could therefore be assumed. A necessary condition for functioning is of course that the sum of all the fine delays must strictly be greater than the coarse delays.

It will also be noted that a positive or negative error in the delay of the digitally controlled oscillator does not have the same consequences. A negative error in the delay may result in a generated frequency that is higher than the limit frequency that the circuit coupled downstream may withstand. Conversely, if the delay is too long, operating cycles are lost but there is no particular risk of causing the circuit to fail. It is therefore appropriate to arrange things in such a way as to privilege a positive error in the delays, to the detriment of a negative error, during exchanges between fine delays and a coarse delay by having a safety margin to cover the uncertainties.

For example, if it is desired to increase the delay and all of the fine delays are used, a coarse delay will be added and the number of fine delays will be maintained or a number of fine delays equal to the coarse delay, reduced by the uncertainty range, will be removed. In the case in which fine delays may no longer be withdrawn and where it is necessary to reduce the delay, a coarse delay will be withdrawn and a number of fine delays at least equal to the coarse delay, increased by the uncertainty range, will be added. If the accuracy of the delays is difficult to control, it is possible to change from zero fine delay to the maximum number of fine delays and to withdraw a coarse delay and then wait for the regulation to again withdraw a certain number of fine delays. It is desirable that the number of fine delays should be sufficient for a change of coarse delay to bring the number of fine delays close to the mean number of fine delays available. In this way, overshoots of the target frequency are limited and better safety is guaranteed with regard to modeling uncertainties. It is thus possible, with low risk, to set the instruction frequency closer to the limit operating frequency of the circuit.

Possible errors are then compensated by the locked loop of the digitally controlled oscillator, the number of lost cycles remains extremely low in comparison with the total number of cycles and the impact on the performance of the circuit is acceptable. The number of lost cycles will depend on the type of interference and on the number of fine delays available. However, the number of fine delays results from the best compromise that may be made since an increase in the number of fine delays reduces the maximum frequency of the digitally controlled oscillator.

Moreover, when several fine delays are substituted for a coarse delay, and vice-versa, it is appropriate to avoid eliminating one of the delays before adding the others. For this purpose, it is appropriate either to synchronize the controls of the digitally controlled oscillator with the passage of the clock edge, or to first set the delays to be added before setting the commands of the delays to be eliminated. In the case of resynchronization, it is possible to provide a resynchronization for each element of the digitally controlled oscillator (see FIG. 5).

Figure 5:
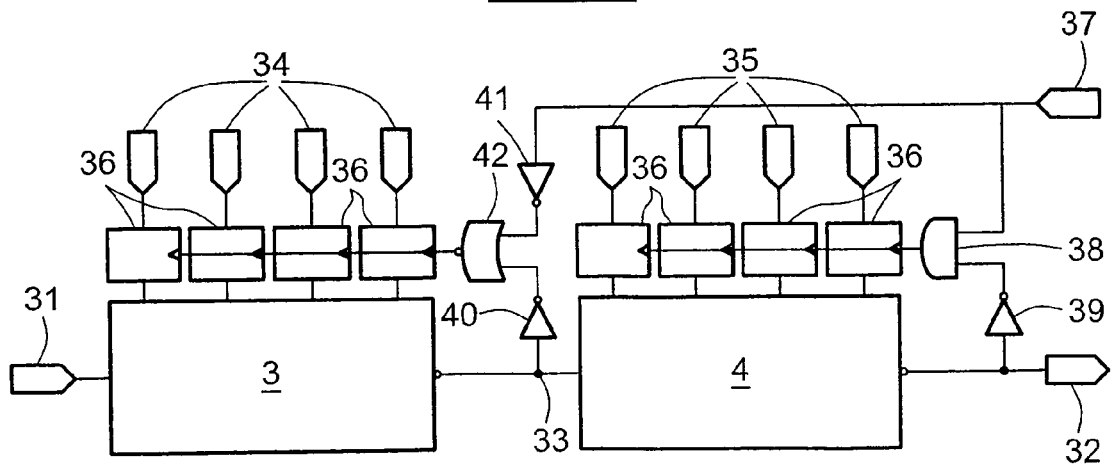
FIG. 5 is a block diagram of a digital delay device.

The digital delay device shown in FIG. 5 includes two fine delay modules 3 and 4 looped back in order to oscillate as illustrated in FIG. 1, one of which includes a signal input 31 and the other of which includes a signal output 32, the output of one being coupled to the input of the other at the node 33. Each module 3, 4 includes delay control inputs 34 and 35, in this case four of them, for each module 3, 4. Between each input 34, 35 and the corresponding module 3, 4, there is provided a latch 36 making it possible to store the corresponding command. The latch 36 may be replaced by a flip-flop.

The latches 36 are open after the passage of the rising edge of the clock signal for the module 3 and the falling edge for the module 4. The oscillator includes a clock mask input (MASK) 37, an AND gate 38 and an inverter 39. The clock mask (MASK) is a signal derived from the reference clock FREF, see FIG. 6 below. The output of the AND gate 38 is coupled to the synchronization input of the latches 36 of the inputs 35. The AND gate 38 has one input coupled to the output of the inverter 39, whose input is itself coupled to the output 32 of the oscillator, and one input coupled to the input 37.

There is also provided an inverter 40 whose input is coupled to the node 33 and an inverter 41 whose input is coupled to the clock mask input 37. The outputs of the inverters 40 and 41 are coupled to the inputs of a NOR gate 42 whose output is coupled to the synchronization input of the latches 36 of the inputs 34. Thus, this type of circuit with latches whose synchronization inputs are coupled to the output signal of a programmable delay device and to the clock mask signal allows the synchronization of the inputs of the same programmable delay device.

Figure 6:
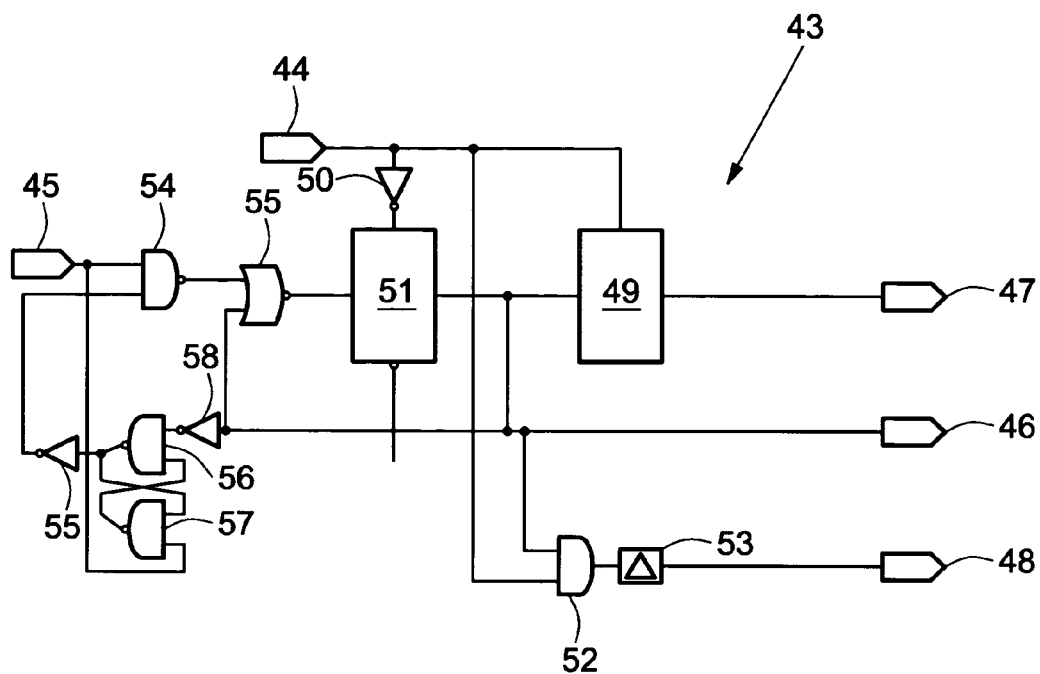
FIG. 6 is a block diagram of a state machine used for generating commands.

FIG. 6 shows an embodiment of a system for sequencing the control and command of a frequency locked loop. The control and command system, given the overall reference 43, makes it possible to count a given number of cycles of the digitally controlled oscillator in each reference period. The sequence begins by sampling the reference clock FREF by the generated frequency FGEN. The sampling errors of the reference frequency are naturally compensated in the following cycles of the reference frequency if necessary. The first cycle of the generated frequency FGEN is marked after the falling edge of the reference clock FREF and then the signals are generated, in particular the clock masks which will be used for changing the digitally controlled oscillator controls and to initialize the loop control counters. On the first rising edge of the generated frequency FGEN, the countdown of the remaining cycles is checked, which may be zero, positive or negative, and the counter is reloaded.

Figure 7:
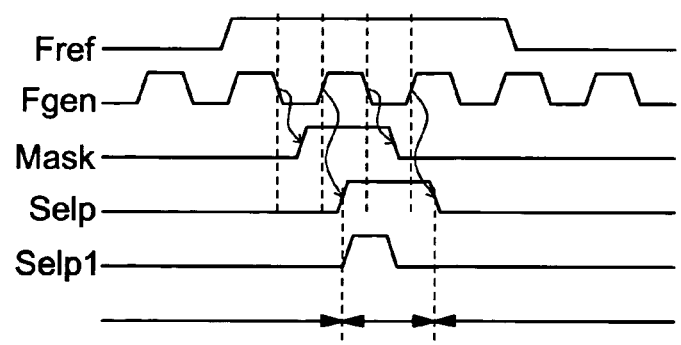
FIG. 7 shows the signals of the state machine of FIG. 6.

For this purpose, the control and command system 43 includes an input 44 receiving the generated frequency FGEN, an input 45 receiving the reference clock FREF, an output 46 supplying the clock mask signal MASK and outputs 47 and 48 supplying signals referenced Selp and Selp1 respectively (see FIG. 7 also). The generated frequency FGEN received on the input 44 is sent on the one hand as a synchronization signal to a flip-flop 49 with asynchronous zero reset and on the other hand, after having been inverted by an inverter 50, to the synchronization input of a register 51. The output of the flip-flop 49 is coupled to the output 47 supplying the signal Selp. The output of the register 51 is coupled to the input of the flip-flop 49 and to the output 46 supplying the clock mask signal. The generated frequency FGEN is also sent to the input of an AND gate 52 whose other input is coupled to the output of the register 51. The output of the AND gate 52 is coupled by the intermediary of the delay module 53 to the output 48 supplying the signal Selp1. The delay module 53 may be produced from logic gates providing a delay in the propagation of the signal.

The reference clock FREF is sent to an input of a NAND gate 54 whose output is coupled to the input of a NOR gate 55 whose output is itself coupled to the input of the register 51. The other input of the NOR gate 55 is coupled to the output of the register 51. The other input of the NAND gate 54 is coupled to the output of an inverter 55 whose input is coupled to an output of a configuration of two NAND gates 56 and 57 coupled as an RS flip-flop, that is to say as a flip-flop with the commands SET and RESET with crossed logic gate inputs. Thus, the NAND gate 56 includes one input coupled by the intermediary of an inverter 58 to the output of the register 51 and another input coupled to the output of the NAND gate 57. The output of the NAND gate 56 is coupled on the one hand to the input of the inverter 55 and on the other hand to an input of the NAND gate 57. The other input of the NAND gate 57 is coupled to the reference clock FREF while the output of the NAND gate 57 is coupled to an input of the NAND gate 56. In other words, the RS flip-flop includes an input coupled to the input 45 and an input coupled to the output of the inverter 58.

If the result of the countdown of remaining cycles is positive, it is appropriate to accelerate the digitally controlled oscillator by removing a fine delay. If there are no more fine delays to remove, it is then appropriate to remove a coarse delay and to add the equivalent in fine delays to which is added a safety margin. If the result is negative, the speed of the digitally controlled oscillator is reduced by adding a fine delay. If there are no more fine delays available, a coarse delay is added and the equivalent fine delays are removed minus a certain safety margin. Finally, if the result is zero, no action is taken on the control of the digitally controlled oscillator.

Figure 8:
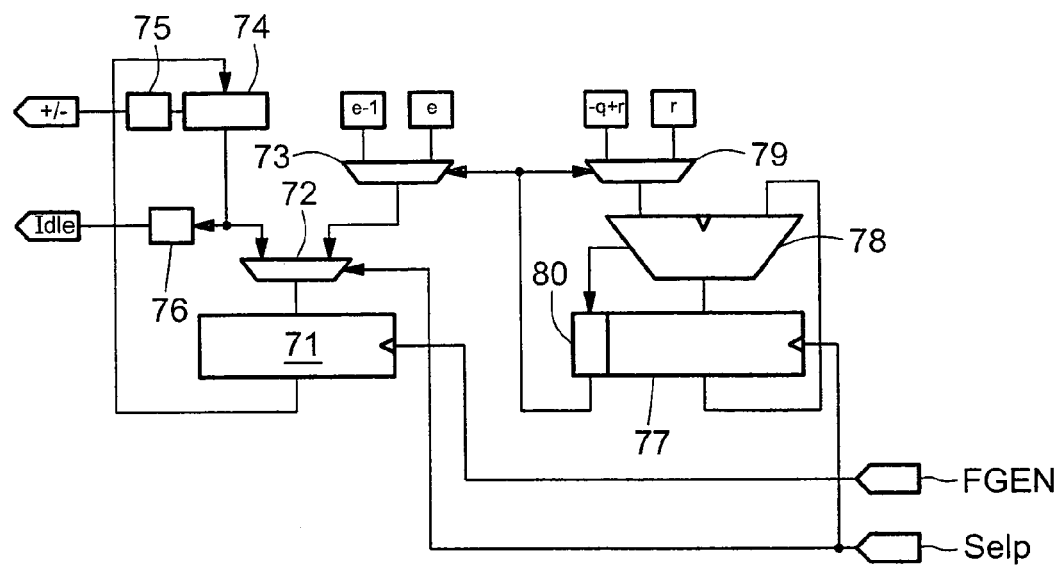
FIG. 8 is a block diagram of a fraction of period counting element.

If it is desired to set an instruction with precision finer than a whole number of reference periods, it is necessary to be able to load the instruction or the instruction incremented by 1, depending on the fractional part of the instruction (see FIG. 8).

The fractions of periods counting element receives the generated clock FGEN and the signal Selp and includes a cycle counting register 71, a multiplexer 72 disposed upstream of the cycle counting register 71, a multiplexer 73 disposed upstream of the multiplexer 72, a decrementing element 74 disposed at the output of the cycle counting register 71, a sign extraction element 75 disposed at the output of the decrementing element 74 and a zero comparator 76 disposed at the output of the decrementing element 74. The output of the decrementing element 74 is also coupled to the input of the multiplexer 72. The output of the zero comparator 76 supplies an "Idle" signal indicating to a delay control that no action is necessary. The output of the sign extraction element 75 supplies a signal "+/−" corresponding to the sign of the output value of the decrementing element 74 and indicating to a delay control that it is appropriate to increase or to reduce the delays.

The fractions of periods counter element furthermore includes a fractions register 77 receiving the signal Selp, an adder 78 whose output is coupled to the input of the fractions register 77 and a multiplexer 79 whose output is coupled to the input of the adder 78. The other input of the adder 78 is coupled to the output of the fractions register 77. The fractions register 77 furthermore includes an overflow indicator 80 whose output makes it possible to time the multiplexers 79 and 73. The multiplexer 73 receives on input the values e and (e−1). The multiplexer 79 receives on input the values (−q+r) and r, the generated frequency FGEN being equal to (e+r/q) FREF.

Thus, the adder 78 by default adds the value r to the fractions register 77. In the case of overflow, the adder 78 adds the value (−q+r) to the fractions register 77, where q>r, and the multiplexer 73 sends on output the value e instead of the default value (e−1). In the next cycle after the Selp signal, the multiplexer 72 sends on output the value e to the cycle counting register 71 which is progressively decremented by the decrementing element 74. It is thus possible to choose the generated frequency with a high degree of freedom with respect to the reference frequency and to use a high reference frequency which is favorable in terms of noise filtering.

It is possible to choose the fractional part proportional to $2^{-n}$. If r/q is the fractional part, where r and q are integers, then counting is by r modulo q in each reference cycle. The +/− and Idle signals are stored throughout the duration of the cycle on the clock FREF and will allow the setting of new delay commands which have been calculated during the preceding cycle including in them the possible exchanges of fine delays for a coarse delay. This is therefore a method which makes it possible to have a good accuracy in the instruction (FREF/q) while retaining a high reference frequency.

Figure 9:
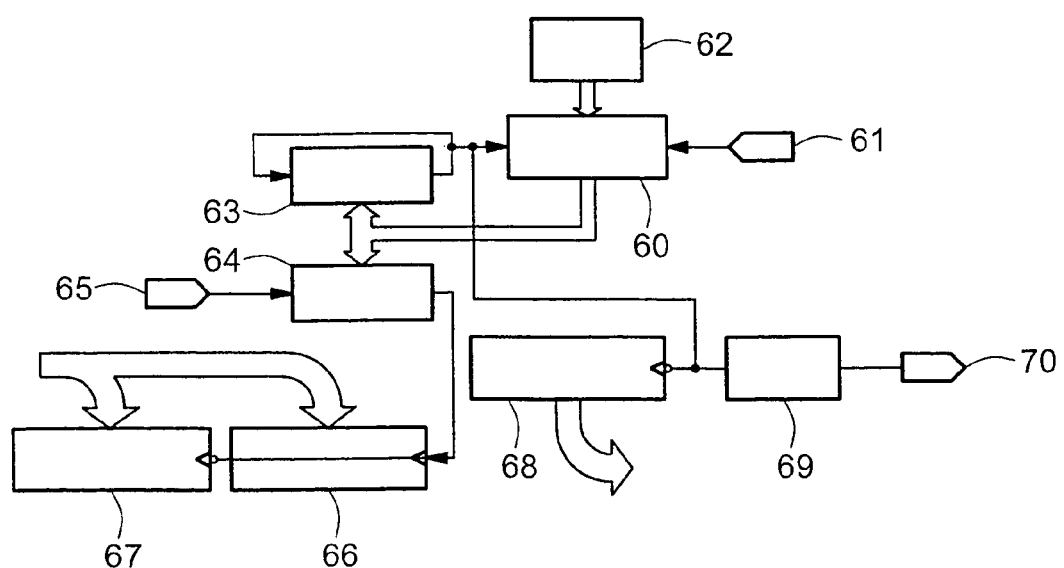
FIG. 9 is a block diagram of a frequency locked.

FIG. 9 shows an SDRAM memory interface architecture. In fact, the SDRAM memory interfaces of the double data rate (DDR) type transmit data to the memory with a quarter-period shift with respect to each data transmission clock edge. On receiving data, an out-of-phase clock is given again with the data, the data this time being synchronized with the clock edges. It is therefore relatively difficult to retrieve the signal which is used for sampling he data on reception. The frequency locked loop as described above makes it possible to generate the transmission clock and the reception clock because, by using two identical digitally controlled delay modules, one of which is looped back, with the same commands, it is relatively easy to generate the same delays.

For this purpose, a loop control and command module 60 is provided receiving on an input 61 a reference clock FREF and also receiving an instruction coming, for example, from a bus 62. The commands coming from the module 60 are sent to two delay generators 63 and 64 which may be identical. The generator 63 is looped back on itself and its output is furthermore sent to the input of the loop control and command module 60. The delay generator 64 receives on one input 65 an input data clock. The delay generator 64 may be equipped with a means of synchronizing the command received from the module 60. The output of the delay generator 64 is coupled to the synchronization inputs of data registers 66 and 67 of an SDRAM memory. A data output register 68 of the same SDRAM memory receives on its synchronization input the output signal of the delay generator 63. The output signal of the delay generator 63 is sent to the input of a divide-by-two divider 69 whose output 70 supplies an output clock signal whose frequency is equal to half the instruction frequency 62. As the signal passes twice through the delay generator for one clock period and the operating frequency of the delay generator is twice the input clock frequency, the delay of the delay generator is equal to one quarter of the input clock period. This delay is precisely that which must be applied to the input clock in order to have the best data sampling signal.

The embodiments described herein have the advantage of a digital oscillator that has particularly good performance while remaining economic by being produced from standard cells.

The device applies to many types of circuits, notably to integrated circuits, and in particular to memories.

The embodiments described herein also have the advantage of using a frequency locked loop or frequency comparator.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description to the invention. Changes may be made in the elements described herein without departing from the spirit and scope of the invention as described in the following claims. In addition, it is to be understood that features described herein independently may, in certain embodiments, be combined.

What is claimed is:

1. Digitally controlled delay device comprising a plurality of fine delay elements and a plurality of coarse delay elements, configured to delay a signal generated by the device, by a fine or coarse delay respectively, the fine delay elements having delay times of between 60 and 170% of the mean of the fine delays, the sum of the fine delay times being greater than or equal to any one of the coarse delays, the coarse delay elements having delay times spaced in such a way that the sum of the fine delay times is greater than or equal to the difference between two adjacent combinations of coarse delay times, and comprising an element for the control and management of the fine delay elements, configured to activate or to deactivate the fine delay elements and coarse delay elements, according to an output of a frequency locked loop.

2. The device of claim 1, wherein the fine delay elements have delay times of between 86% and 116% of the mean of the fine delays.

3. The device of claim 1, wherein the fine delay elements have delay times of between 90% and 110%.

4. The device of claim 1, wherein the coarse delay elements have delay times having the same relative accuracy as the fine delays.

5. The device of claim 1, wherein the control and management element of the fine delay carries out activation of a coarse delay element without modification of the fine delay elements, and the control and management element of the fine delay carries out deactivation of a coarse delay element while activating fine delay elements in order to prevent a large change in the sum of the delays.

6. The device of claim 5, wherein the control and management element comprises a means of synchronization of the control of the fine delay elements and of the coarse delay elements.

7. The device of claim 1, wherein at least one fine delay element comprises an active component provided with a capacitance, the delay variation being due to the Miller effect.

8. The device of claim 7, wherein the fine delay element comprises means of activation and of partial deactivation of the capacitance.

9. The device of claim 7, wherein the fine delay element comprises a gate with at least two inputs.

10. The device of claim 9, wherein the gate comprises an isolated output.

11. The device of claim 9, wherein the gate comprises a delay adjustment control input.

12. The device of claim 7, wherein the fine delay element comprises an inverter.

13. The device of claim 7, further comprising a plurality of coupled fine delay elements.

14. The device of claim 1, further comprising a means of counting a fractional part of a reference clock period.

15. Memory interface comprising two devices according to claim 1, one of the devices being looped back.

16. Interface according to claim 15, wherein the two devices are coupled to a same control.

* * * * *